United States Patent
Fukui et al.

(10) Patent No.: US 12,159,907 B2
(45) Date of Patent: Dec. 3, 2024

(54) SEMICONDUCTOR FILM

(71) Applicant: NGK INSULATORS, LTD., Nagoya (JP)

(72) Inventors: Hiroshi Fukui, Obu (JP); Morimichi Watanabe, Nagoya (JP); Jun Yoshikawa, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 297 days.

(21) Appl. No.: 17/588,708

(22) Filed: Jan. 31, 2022

(65) Prior Publication Data
US 2022/0157946 A1 May 19, 2022

Related U.S. Application Data

(63) Continuation of application No. PCT/JP2019/034445, filed on Sep. 2, 2019.

(51) Int. Cl.
*H01L 29/24* (2006.01)
*H01L 29/06* (2006.01)

(52) U.S. Cl.
CPC .......... *H01L 29/24* (2013.01); *H01L 29/0657* (2013.01)

(58) Field of Classification Search
CPC ... H01L 29/24; H01L 29/0657; H01L 29/872; H01L 29/045; H01L 21/02488; H01L 21/0242; H01L 21/02433; H01L 21/02483; H01L 21/02565; H01L 21/02576; H01L 21/0262; H01L 21/02628; C23C 16/4481; C23C 16/40; C23C 24/04; C30B 25/02; C30B 29/16
See application file for complete search history.

(56) References Cited

U.S. PATENT DOCUMENTS 8,048,702 B2 * 11/2011 Enya ................. H01L 21/02433
438/22
2005/0274975 A1 12/2005 Shibata
(Continued)

FOREIGN PATENT DOCUMENTS

| CN | 106796891 A | 5/2017 |
| EP | 3 178 972 A1 | 6/2017 |

(Continued)

OTHER PUBLICATIONS

International Search Report and Written Opinion (with English translation) dated Nov. 26, 2019 (Application No. PCT/JP2019/034445).

(Continued)

*Primary Examiner* — Dale E Page
*Assistant Examiner* — Quovaunda Jefferson
(74) *Attorney, Agent, or Firm* — BURR PATENT LAW, PLLC (57) ABSTRACT

Provided is a α-Ga$_2$O$_3$ based semiconductor film which is a semiconductor film in a circular shape having a crystal having a corundum-type crystal structure composed of α-Ga$_2$O$_3$ or an α-Ga$_2$O$_3$ solid solution as a main phase. The maximum value $\theta_{max}$ and the minimum value $\theta_{min}$ for off-angles at the center point X and four outer circumferential points A, B, C, and D of a surface of the semiconductor film satisfy the relationship of $\theta_{max}-\theta_{min} \leq 0.30°$. The off-angle is defined as an inclination angle θ of a crystal axis oriented in the substantially normal direction of the semiconductor film with respect to the film surface normal of the semiconductor film.

7 Claims, 5 Drawing Sheets

(56) References Cited

U.S. PATENT DOCUMENTS

| | | |
|---|---|---|
| 2005/0274976 A1 | 12/2005 | Shibata |
| 2009/0233423 A1 | 9/2009 | Meguro et al. |
| 2014/0217470 A1* | 8/2014 | Sasaki ................. H01L 29/7869 |
| | | 257/192 |
| 2017/0233892 A1 | 8/2017 | Sasaki |
| 2017/0278706 A1 | 9/2017 | Oda et al. |
| 2018/0061952 A1 | 3/2018 | Tokuda et al. |

FOREIGN PATENT DOCUMENTS

| | | |
|---|---|---|
| EP | 3 536 828 A1 | 9/2019 |
| JP | 2005-343713 A | 12/2005 |
| JP | 2005-350315 A | 12/2005 |
| JP | 2009-208991 A | 9/2009 |
| JP | 2014-072533 A | 4/2014 |
| JP | 2016-025256 A | 2/2016 |
| JP | 2016-037417 A | 3/2016 |
| JP | 2017-069424 A | 4/2017 |
| JP | 2018-082144 A | 5/2018 |
| JP | 2019-016718 A | 1/2019 |
| WO | 2013/035843 A1 | 3/2013 |
| WO | 2018/084304 A1 | 5/2018 |

OTHER PUBLICATIONS

Extended European Search Report (Application No. 19944299.7) dated Apr. 14, 2023.
Chinese Office Action (with English translation) dated Jan. 6, 2024 (Application No. 201980098054.7).

* cited by examiner

SEMICONDUCTOR FILM

CROSS-REFERENCE TO RELATED APPLICATIONS

This application is a continuation application of PCT/JP2019/034445 filed Sep. 2, 2019, the entire content of which is incorporated herein by reference.

BACKGROUND OF THE INVENTION

1. Field of the Invention

The present invention relates to $\alpha$-$Ga_2O_3$ based semiconductor film.

2. Description of the Related Art

In recent years, gallium oxide ($Ga_2O_3$) has been attracting attention as a material for semiconductors. Gallium oxide is known to have five crystal forms of $\alpha$, $\beta$, $\gamma$, $\delta$, and $\epsilon$, and among them, $\alpha$-$Ga_2O_3$, which is a semi-stable phase, has a very large band gap of 5.3 eV, and is expected as a material for power semiconductors.

For example, Patent Literature 1 (JP2014-72533A) discloses a semiconductor device including a base substrate having a corundum-type crystal structure, a semiconductor layer having a corundum-type crystal structure, and an insulating film having a corundum-type crystal structure, and describes an example in which an $\alpha$-$Ga_2O_3$ film is formed as a semiconductor layer on a sapphire substrate. Further, Patent Literature 2 (JP2016-25256A) discloses a semiconductor device including an n-type semiconductor layer containing a crystalline oxide semiconductor having a corundum structure as a main component, a p-type semiconductor layer containing an inorganic compound having a hexagonal crystal structure as a main component, and an electrode. In the examples of Patent Literature 2, it is disclosed that a diode is prepared by forming an $\alpha$-$Ga_2O_3$ film having a corundum structure which is a metastable phase as an n-type semiconductor layer and an $\alpha$-$Rh_2O_3$ film having a hexagonal crystal structure as a p-type semiconductor layer on a c-plane sapphire substrate.

Further, Patent Literature 3 (WO2013/035843) discloses a MOSFET (also called MISFET) using an $\alpha$-$Ga_2O_3$ based semiconductor, and its use as a power device utilizing a high dielectric breakdown electric field is being studied. Patent Literature 4 (JP2019-16718A) discloses a Schottky barrier diode using an $\alpha$-$Ga_2O_3$ based semiconductor.

CITATION LIST

Patent Literature

Patent Literature 1: JP2014-72533A
Patent Literature 2: JP2016-25256A
Patent Literature 3: WO2013/035843
Patent Literature 4: JP2019-16718A

SUMMARY OF THE INVENTION

A power device as described above is prepared by forming a functional layer (for example, a drift layer) and an electrode on an $\alpha$-$Ga_2O_3$ based wafer, forming an element, and cutting the element. The $\alpha$-$Ga_2O_3$ based wafer may be a) a wafer in which an $\alpha$-$Ga_2O_3$ based semiconductor film is formed on a base substrate for film formation such as sapphire, b) a wafer in which an $\alpha$-$Ga_2O_3$ based semiconductor film formed on a base substrate for film formation is transferred from a base substrate for film formation to another support substrate, c) a wafer in which an $\alpha$-$Ga_2O_3$ based semiconductor film formed in a thick thickness may be detached and made self-supporting, or the like. In any case, the $\alpha$-$Ga_2O_3$ based wafer is a wafer including an $\alpha$-$Ga_2O_3$ based semiconductor film or composed of an $\alpha$-$Ga_2O_3$ based semiconductor film, and a plurality of elements can be prepared from such a single $\alpha$-$Ga_2O_3$ based wafer or semiconductor film through element formation and cutting. However, there is a problem that among the plurality of elements thus obtained, there are few elements capable of obtaining dielectric breakdown characteristics as designed, that is, the yield of the product is reduced.

The present inventors have currently found that a semiconductor film having a small in-plane distribution of the off-angles can be formed over a wide range from the center portion to the outer circumferential portion of the semiconductor film, and thereby it is possible to significantly increase the yield of devices prepared using an $\alpha$-$Ga_2O_3$ based semiconductor film.

Accordingly, an object of the present invention is to provide a $\alpha$-$Ga_2O_3$ based semiconductor film capable of significantly increasing the yield of devices.

According to an aspect of the present invention, there is provided a semiconductor film in a circular shape having a crystal having a corundum-type crystal structure composed of $\alpha$-$Ga_2O_3$ or an $\alpha$-$Ga_2O_3$ solid solution as a main phase,
wherein the maximum value $\theta_{max}$ and the minimum value $\theta_{min}$ for off-angles at the center point X and four outer circumferential points A, B, C, and D of a surface of the semiconductor film satisfy the relationship of $\theta_{max} - \theta_{min} \leq 0.30°$,
wherein the off-angle is defined as an inclination angle $\theta$ of a crystal axis oriented in a substantially normal direction of the semiconductor film with respect to a film surface normal of the semiconductor film, and
wherein the outer circumferential points A, B, C, and D are determined such that i) a straight line connecting the outer circumferential points A and C and a straight line connecting the outer circumferential points B and D intersect at a right angle to each other at the center point X, and ii) the respective shortest distances of the outer circumferential points A, B, C, and D from the outer edge of the semiconductor film are $\frac{1}{5}$ of the radius of the semiconductor film.

According to another aspect of the present invention, there is provided a composite material comprising a support substrate in a circular shape and the semiconductor film formed on the support substrate.

DETAILED DESCRIPTION OF THE INVENTION

Semiconductor Film

Figure 1:
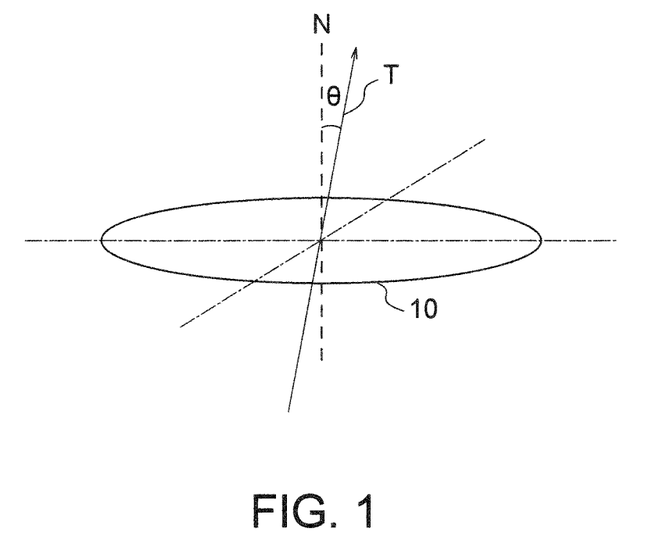
FIG. 1 is a diagram for explaining an off-angle on a surface of a semiconductor film of the present invention.
Figure 2:
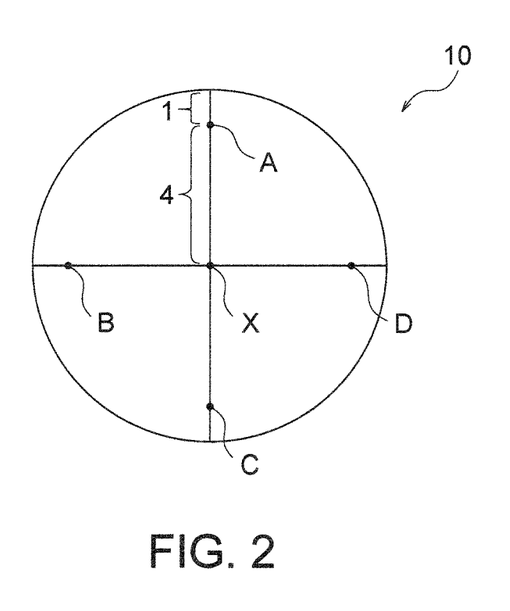
FIG. 2 is a diagram for explaining positions of a center point X and four outer circumferential points A, B, C, and D on the surface of the semiconductor film of the present invention.

The semiconductor film according to the present invention has a crystal having a corundum-type crystal structure as a main phase, and this corundum-type crystal structure is composed of α-$Ga_2O_3$ or an α-$Ga_2O_3$ solid solution. Therefore, the semiconductor film according to the present invention can be referred to as an α-$Ga_2O_3$ based semiconductor film. This semiconductor film is in a circular shape and can therefore be used as a semiconductor wafer. The maximum value $\theta_{max}$ and the minimum value $\theta_{min}$ for the off-angles at the center point X and four outer circumferential points A, B, C, and D of the surface of the semiconductor film satisfy the relationship of $\theta_{max}-\theta_{min} \leq 0.30°$. Herein, as shown in FIG. 1, the off-angle is defined as an inclination angle θ of a crystal axis T oriented in the substantially normal direction of the semiconductor film 10 with respect to the film surface normal N of the semiconductor film 10. Further, as shown in FIG. 2, the outer circumferential points A, B, C, and D are determined such that i) a straight line connecting the outer circumferential points A and C and a straight line connecting the outer circumferential points B and D intersect at a right angle to each other at the center point X, and ii) the respective shortest distances of the outer circumferential points A, B, C, and D from the outer edge of the semiconductor film are ⅕ of the radius of the semiconductor film. In a semiconductor film in which the maximum value $\theta_{max}$ and the minimum value $\theta_{min}$ for the off-angles satisfy the relationship of $\theta_{max}-\theta_{min} \leq 0.30°$ at five points sufficiently separated from each other as described above, the in-plane distribution of the off-angles is small over a wide range from the center portion to the outer circumferential portion, and it is possible to significantly increase the yield of a device prepared by using the semiconductor film.

As described above, in the related art, in the case of preparing a plurality of elements through element formation and cutting from a single α-$Ga_2O_3$ based wafer or semiconductor film, there is a problem that among the plurality of elements thus obtained, there are few elements capable of obtaining dielectric breakdown characteristics as designed, that is, the yield of the product is reduced. In this regard, the present inventors have intensively studied the cause of the low yield, and have found that when the off-angles of the α-$Ga_2O_3$ based wafer or the semiconductor film has an in-plane distribution, the dielectric breakdown electric field characteristics of the functional layer (for example, the drift layer) formed thereon have a variation, which affects the yield of the element. Although the cause of this is unclear, it is considered that, since regions having different off-angles exist in the wafer or semiconductor film, regions having different off-angles are inherited by the functional layer, and elements having different dielectric breakdown electric field characteristics are formed. As for the effect of the in-plane distribution of the off-angles on the dielectric breakdown electric field characteristic, the following two possibilities are considered as possible estimation mechanisms.

1) In a case where a functional layer is formed, the amount of incorporated impurities such as dopants and the activation state are different between regions having different off-angles, which affects the resistivity and the dielectric breakdown electric field characteristics. Therefore, when a functional layer is formed on a wafer or semiconductor film having an in-plane distribution of the off-angles, regions having different dielectric breakdown electric field characteristics may be formed. In this regard, when the difference in the off-angle is small, the difference in the amount of incorporated impurities or the activated state becomes small.

2) Stress is concentrated on the boundary between regions having different off-angles, and crystal defects such as dislocations and grain boundaries are likely to occur. Therefore, it is considered that dielectric breakdown is likely to occur in an element having an off-angle boundary inside. In this regard, when the difference in off-angle is small, the stress generated at the boundary becomes small, and crystal defects are less likely to occur.

In this regard, in the semiconductor film of the present invention, the maximum value $\theta_{max}$ and the minimum value $\theta_{min}$ for the off-angles at the center point X and four outer circumferential points A, B, C, and D of the surface of the semiconductor film satisfy the relationship of $\theta_{max}-\theta_{min} \leq 0.30°$. Since this can be said to be a semiconductor film having a small off-angle range ($\theta_{max}-\theta_{min}$), based on the estimation mechanism described above, it is considered that the variation in the dielectric breakdown electric field characteristic in the functional layer caused by the in-plane distribution of the off-angles is reduced, and the yield of device is significantly increased. Therefore, the properties of the functional layer becomes uniform, and it becomes possible to manufacture a power device with a high yield. The off-angle range ($\theta_{max}-\theta_{min}$) is 0.30° or less, preferably 0.20° or less. From the viewpoint of improving the yield of the device, the smaller the in-plane distribution of the off-angles is, the better. Thus, the lower limit value of the off-angle range is not particularly limited and is ideally 0°, but typically 0.01° or more.

The off-angle can be measured by a known method. For example, an automatic X-ray crystal orientation measuring device (FSAS III manufactured by Rigaku) can be used to measure the off-angle with a sampling width of 0.01° and a scanning speed of 10°/min. In the present invention, the in-plane distribution of the off-angles is represented by the off-angle at a total of five points including the center point X and the four outer circumferential points A, B, C, and D on the surface of the semiconductor film. This is because, in a case where the in-plane distribution of the off-angles is evaluated, the evaluation of the entire area of the semiconductor film surface is time-consuming and impractical.

As described above, the semiconductor film of the present invention has a crystal having a corundum-type crystal structure as a main phase. Herein, "having a crystal having a corundum-type crystal structure as a main phase" means that the crystal having a corundum-type crystal structure is 80% by weight or more, preferably 90% by weight or more, more preferably 95% by weight or more, still more preferably 97% by weight or more, particularly preferably 99% by weight or more, and most preferably 100% by weight of the semiconductor film. This corundum-type crystal structure is composed of an α-$Ga_2O_3$ or α-$Ga_2O_3$ solid solution. α-$Ga_2O_3$ belongs to a trigonal crystal group and has a corundum-type crystal structure, and its c-plane is three-fold symmetric. Further, the α-$Ga_2O_3$ solid solution is a solid solution in which other components are dissolved in α-$Ga_2O_3$, and the corundum-type crystal structure is maintained. For example, the semiconductor film of the present invention may be composed of an α-$Ga_2O_3$ solid solution in which one or more components selected from the group consisting of $Cr_2O_3$, $Fe_2O_3$, $Ti_2O_3$, $V_2O_3$, $Ir_2O_3$, $Rh_2O_3$, $In_2O_3$, and $Al_2O_3$ are dissolved in α-$Ga_2O_3$. All of these components have a corundum-type crystal structure, and their lattice constants are relatively close to each other. Therefore, the metal atoms of these components easily replace Ga atoms in the solid solution. Further, by dissolving these components in solid solution, it becomes possible to control the band gap, electrical characteristics, and/or lattice constant of the semiconductor film. The amount of solid solution of these components can be appropriately changed according to the desired characteristics. Further, the α-$Ga_2O_3$ solid solution may contain, as other components, elements such as Si, Sn, Ge, N, and Mg as dopants.

The orientation direction of the α-$Ga_2O_3$ based semiconductor film of the present invention in the substantially normal direction is not particularly limited, but is preferably c-axis orientation. However, a typical α-$Ga_2O_3$ based semiconductor film is composed of α-$Ga_2O_3$ or a mixed crystal of α-$Ga_2O_3$ and a different material, and is oriented in the biaxial direction of the c-axis and the a-axis. As long as it is biaxially oriented, the α-$Ga_2O_3$ based semiconductor film may be any of single-crystal or mosaic crystal. A mosaic crystal is a group of crystals which do not have clear grain boundaries but have slightly different crystal orientations in one or both of the c-axis and a-axis. The evaluation method of the biaxial orientation is not particularly limited, but a known analysis method such as an EBSD (electron back scatter diffraction patterns) method or X-ray pole figure can be used. For example, in a case where the EBSD method is used, the reverse pole figure mapping of the surface (film surface) or the cross-section orthogonal to the film surface of the biaxially oriented α-$Ga_2O_3$ film is measured. In the obtained reverse pole figure mapping, when two conditions of (A) being oriented in a specific direction in the substantially normal direction of a film surface and (B) being oriented in an axis orthogonal to the orientation direction in the substantially normal direction in the substantially in-plane direction of the film surface orthogonal to the normal direction are satisfied, it can be defined that the film is oriented in two axes of the substantially normal direction and the substantially film surface direction. In other words, in a case where the above two conditions are satisfied, the orientation is determined to be in the two axes of the c-axis and the a-axis. For example, in a case where the substantially normal direction of the film surface is oriented to the c-axis, the substantially in-plane direction of the film surface may be oriented to a specific direction (for example, the a-axis) orthogonal to the c-axis.

The semiconductor film of the present invention has a circular shape, preferably has a diameter of 5.08 cm (2 inches) or more, and may have a diameter of 10.0 cm or more. The upper limit value of the size of the semiconductor film is not particularly limited, but is typically 30.0 cm or less in diameter, and more typically 20.0 cm or less in diameter. Herein, the "circular shape" need not be a complete circular shape, but may be a substantially circular shape which can be generally recognized as a circular shape as a whole. For example, a portion of the circle may be cut out for the purpose of specifying the crystal orientation or other purposes. In this case, the outer edge shape of the semiconductor film to be taken into consideration in a case where defining the center point X and the four outer circumferential points A, B, C, and D may be determined based on a circular shape assumed in a case where it is assumed that there is no notch. Incidentally, the semiconductor film of the present invention is characterized in that the in-plane distribution of the off-angles is small, and the center point X and outer circumferential points A, B, C, and D are only specified for convenience so that the representative off-angle of the entire semiconductor film can be evaluated. Therefore, in order to uniquely determine the positions of the center point X and the outer circumferential points A, B, C and D, the shape of the semiconductor film is designated as circular, but the essential meaning is no different even when the shape of the semiconductor film is not circular. For example, even when the shape of the semiconductor film is square or rectangular (oblong), it can be regarded as an equivalent of the semiconductor film of the present invention as long as in-plane distribution of the off-angles of the semiconductor film is small. In the semiconductor film having such a shape, the largest circle inscribed in the outer circumference of the film when a square or rectangular semiconductor film is viewed from the top is defined as a virtual circle, and the positions of the outer circumferential points A, B, C and D may be determined from the center point X of the virtual circle and the diameter of the virtual circle (in the same manner as in the case of the circular semiconductor film described above). By evaluating the off-angle at the center point X and the outer circumferential points A, B, C, and D determined in this way, the same evaluation as that of the circular semiconductor film can be performed.

In the semiconductor film of the present invention, it is preferable that in a case where the off-angle at the center point X is $θ_X$ and an arithmetic mean angle of the off-angles of the outer circumferential points A, B, C, and D is $θ_{out}$ $(=(θ_A+θ_B+θ_C+θ_D)/4)$, the relationship of $θ_X<θ_{out}$ is satisfied. In other words, it is desirable that the off-angle of the central portion of the semiconductor film is smaller than the arithmetic mean value of the off-angles of the four outer circumferential portions excluding the central portion. In this case, $Δθ$ $(=θ_{out}-θ_X)$ representing the difference between $θ_X$ and $θ_{out}$ preferably satisfies the relationship of $0°≤Δθ≤0.20°$, more preferably $0°≤Δθ≤0.10°$, and typically $0.01°≤Δθ≤0.10°$. By satisfying the above relationship, it is possible to increase the yield of devices prepared using the α-$Ga_2O_3$ based semiconductor film more effectively.

Although the cause of the off-angle distribution in the α-$Ga_2O_3$ based semiconductor film is unclear, it is considered to be formed for the following reasons. First, the existence of regions having different off-angles means that there are regions having slightly different orientation directions on the surface of the semiconductor film. Although the reason why the orientation direction of the α-$Ga_2O_3$ based semiconductor film is deviated is unclear, it is considered to be caused by the non-uniform film formation state when the semiconductor film is formed on the base substrate. Specifically, it is considered that the growth behavior of the semiconductor film becomes non-uniform and the semiconductor film is grown with the misalignment of the orientation direction in a case where the film formation conditions such as the substrate temperature, the raw material, and the supply amount of dopant are non-uniform in the plane of the base substrate for film formation or in a case where the surface state of the base substrate for film formation is different in the plane. For example, i) in a case where the temperature-increasing rate during film formation is too fast, a temperature distribution is likely to occur on the base substrate. ii) when the flow rates of the film-forming gas and the carrier gas are uneven in the plane of the base substrate for film formation, the growth behavior tends to be non-uniform. iii) in a case where a base substrate for film formation with a large warpage is used, the growth behavior may become non-uniform.

With respect to the above iii), when the warpage of the base substrate is large, the substrate holder such as a susceptor and the base substrate partially come into contact with each other, and the substrate temperature tends to be uneven. Further, the warpage causes stress on the surface of the base substrate for film formation, and the lattice constant becomes non-uniform. This is also considered to be one of the factors of the non-uniform growth behavior. Even in a case where a thin base substrate is used, warpage is likely to occur during film formation. For example, in a case where a substrate that causes lattice mismatch with an $\alpha$-$Ga_2O_3$ based semiconductor film, such as sapphire, is used as the base substrate for film formation, warpage is likely to occur. Examples of effective techniques for suppressing warpage during film formation include application of appropriate film formation conditions, use of a thick base substrate for film formation, application of a support that suppresses warpage, and application of a base substrate for film formation having a lattice constant close to that of the $\alpha$-$Ga_2O_3$ based semiconductor film (for example, a $Cr_2O_3$ single-crystal or a composite base substrate described later).

The non-uniformity of the growth behavior of the semiconductor film as described above tends to become more significant as the substrate size increases. For example, the influence increases as the diameters of the substrates become 5.08 cm (2 inches) or more, 10.0 cm (4 inches) or more, and 15.24 cm (6 inches) or more. In this regard, since the semiconductor film of the present invention has a small in-plane distribution of off-angles even when the base substrate is large (for example, 5.08 cm (2 inches) or more in diameter, 10.0 cm (4 inches) or more in diameter, or 15.24 cm (6 inches) or more in diameter), more devices can be produced from single semiconductor film or wafer with a high yield.

However, an $\alpha$-$Ga_2O_3$-based semiconductor film formed on a substrate such as a sapphire substrate having a lattice constant different from that of $\alpha$-$Ga_2O_3$ may be an aggregate (mosaic crystal) of domains having slightly different crystal orientations depending on film formation conditions. The cause of this is not clear, but it may be attributed to the fact that $\alpha$-$Ga_2O_3$ is a metastable phase and therefore the film formation temperature is relatively low. Since the film formation temperature is low, it is difficult for the adsorbed components to migrate on the substrate surface, thus suppressing step-flow growth. Therefore, the growth mode of island-shaped growth (three-dimensional growth) tends to be dominant. In particular, in a case where the lattice mismatch between the $\alpha$-$Ga_2O_3$ based semiconductor film and the base substrate for film formation is large, each island-shaped growth part (domain) may have slightly different crystal orientation. For this reason, the domains do not meet completely and tend to form mosaic crystals. It is also considered that the off-angle distribution may occur due to the accumulation of such microscopic differences in the orientation direction. Therefore, it is preferable to suppress the mosaicity by appropriately controlling the film formation conditions such as the film formation temperature and the raw material supply rate. Further, it is considered effective to apply a $Cr_2O_3$ single-crystal having a lattice constant close to that of the $\alpha$-$Ga_2O_3$ based semiconductor film or a composite base substrate to be described later. By appropriately selecting the film formation conditions and the base substrate for film formation as described above, the misalignment of the orientation direction of the $\alpha$-$Ga_2O_3$-based semiconductor film is reduced, and as a result, an $\alpha$-$Ga_2O_3$-based semiconductor film having a small in-plane distribution of the off-angles can be realized.

The film thickness of the semiconductor film of the present invention may be appropriately adjusted from the viewpoint of cost and required characteristics. That is, it takes time to form a film when the film to be formed is too thick, so it is preferable that the film is not extremely thick from the viewpoint of cost. Further, in a case where a device that requires a particularly high dielectric strength is prepared, it is preferable to prepare a thick film. On the other hand, in a case where a device that requires conductivity in the vertical direction (thickness direction) is prepared, it is preferable to prepare a thin film. As described above, the film thickness may be appropriately adjusted according to the desired characteristics, but is typically 0.1 to 50 μm, 0.2 to 20 μm, or 0.2 to 10 μm. By setting the thickness in such a range, it is possible to achieve both cost and semiconductor characteristics. In a case where a self-standing semiconductor film is required, a thick film may be used, for example, 50 μm or more, or 100 μm or more, and there is no particular upper limit unless there is a cost limitation.

The semiconductor film of the present invention can contain a Group 14 element as a dopant. Here, the term "Group 14 element" refers to a Group 14 element according to the periodic table formulated by the IUPAC (International Union of Pure and Applied Chemistry), and specifically, is any one of carbon (C), silicon (Si), germanium (Ge), tin (Sn) and lead (Pb). The content of the dopant (Group 14 element) in the semiconductor film is preferably $1.0 \times 10^{16}$ to $1.0 \times 10^{21}/cm^3$, more preferably $1.0 \times 10^{17}$ to $1.0 \times 10^{19}/cm^3$. It is preferable that these dopants are uniformly distributed in the film and the dopant concentrations on the top surface and the bottom surface of the semiconductor film are about the same.

The semiconductor film of the present invention may be in the form of a self-standing film of a single film or may be formed on a support substrate. In the latter case, the semiconductor film of the present invention may be formed on a support substrate in a circular shape. The support substrate preferably has a diameter of 5.08 cm (2 inches) or more. The size of the support substrate may be 10.0 cm or more as in the case of the size of the semiconductor film, and the upper limit value is not particularly limited, but is typically 30.0 cm or less in diameter, and more typically 20.0 cm or less in diameter. The thickness of the support substrate is preferably 0.5 mm or more, more preferably 0.8 mm or more, still more preferably 1.4 mm or more. With such a thickness, warpage of the support substrate is less likely to occur during film formation, and a semiconductor film having a small in-plane distribution of the off-angles is more likely to be formed. The upper limit of the thickness of the support substrate is not particularly limited, but is typically 5.0 mm or less, and more typically 4.0 mm or less.

The support substrate is preferably a substrate having a corundum structure and oriented in two axes, the c-axis and the a-axis (biaxial orientation substrate). By using a biaxial orientation substrate having a corundum structure as the support substrate, the semiconductor film can also serve as a seed crystal for heteroepitaxial growth. The biaxial orientation substrate may be a polycrystal, a mosaic crystal (a set of crystals of which crystal orientations are slightly deviated), or a single-crystal such as sapphire or $Cr_2O_3$. As long as it has a corundum structure, it may be composed of a single material or a solid solution of a plurality of materials. The main component of the support substrate is a material selected from the group consisting of $\alpha\text{-}Cr_2O_3$, $\alpha\text{-}Fe_2O_3$, $\alpha\text{-}Ti_2O_3$, $\alpha\text{-}V_2O_3$, $\alpha\text{-}Rh_2O_3$, and $\alpha\text{-}Al_2O_3$, or a solid solution containing two or more selected from the group consisting of $\alpha\text{-}Al_2O_3$, $\alpha\text{-}Cr_2O_3$, $\alpha\text{-}Fe_2O_3$, $\alpha\text{-}Ti_2O_3$, $\alpha\text{-}V_2O_3$, and $\alpha\text{-}Rh_2O_3$. Among them, sapphire ($\alpha\text{-}Al_2O_3$ single-crystal) is particularly preferable from the viewpoint of excellent thermal conductivity and commercial availability of large-area and high-quality substrates, and $\alpha\text{-}Cr_2O_3$ or solid solutions of $\alpha\text{-}Cr_2O_3$ and different materials are particularly preferable from the viewpoint of reduction of crystal defects.

Further, as a seed crystal for support substrate and heteroepitaxial growth, a composite base substrate in which an orientation layer composed of a material having a corundum-type crystal structure having an a-axis length and/or a c-axis length larger than that of sapphire is formed on a corundum single crystal such as sapphire or $Cr_2O_3$ can be used. The orientation layer contains a material selected from the group consisting of $\alpha\text{-}Cr_2O_3$, $\alpha\text{-}Fe_2O_3$, $\alpha\text{-}Ti_2O_3$, $\alpha\text{-}V_2O_3$, and $\alpha\text{-}Rh_2O_3$, or a solid solution containing two or more selected from the group consisting of $\alpha\text{-}Al_2O_3$, $\alpha\text{-}Cr_2O_3$, $\alpha\text{-}Fe_2O_3$, $\alpha\text{-}Ti_2O_3$, $\alpha\text{-}V_2O_3$, and $\alpha\text{-}Rh_2O_3$.

Further, the semiconductor film prepared on the base substrate for film formation may be separated and reprinted on another support substrate. The material of the other support substrate is not particularly limited, but a suitable material may be selected from the viewpoint of material properties. For example, from the viewpoint of thermal conductivity, a metal substrate made of Cu or the like, a ceramic substrate made of SiC, AlN or the like, is preferably used. It is also preferable to use a substrate having a coefficient of thermal expansion of 6 to 13 ppm/K at 25 to 400° C. By using a support substrate having such a coefficient of thermal expansion, the difference in thermal expansion between the semiconductor film and the support substrate can be reduced, and as a result, the occurrence of cracks in the semiconductor film due to thermal stress and the detachment of the film can be suppressed. An example of such a support substrate is a substrate made of a Cu—Mo composite metal. The composite ratio of Cu and Mo can be appropriately selected in consideration of the matching of the coefficient of thermal expansion with the semiconductor film, the thermal conductivity, the conductivity and the like.

Method for Manufacturing Semiconductor Film

The semiconductor film of the present invention can be manufactured by using a support substrate (preferably a sapphire substrate or a composite base substrate) described above as a base substrate and forming a film of an $\alpha\text{-}Ga_2O_3$ material thereon (on an orientation layer in the case of the composite base substrate). The semiconductor layer can be formed by a known method, and preferred examples thereof include a mist CVD method (mist chemical vapor deposition method), an HVPE method (halide vapor deposition method), an MBE method (molecular beam epitaxy method), an MOCVD method (metal organic chemical vapor deposition method), a hydrothermal synthesis method, and the mist CVD method or the HVPE method is particularly preferred. In the case of a vapor deposition method such as a mist CVD method or an HVPE method, the thickness of the base substrate is preferably 0.5 mm or more, more preferably 0.8 mm or more, still more preferably 1.4 mm or more. With such a thickness, warpage of the base substrate is less likely to occur during film formation, and a semiconductor film having a small in-plane distribution of the off-angles is more likely to be formed. The upper limit of the thickness of the base substrate is not particularly limited, but is typically 5.0 mm or less, and more typically 4.0 mm or less.

Hereinafter, the HVPE method and the mist CVD method, which are particularly preferable film forming methods, will be described.

The HVPE method (halide vapor phase epitaxy method) is a type of CVD and is a method applicable to film formation of compound semiconductors such as $Ga_2O_3$ and GaN. In this method, the Ga raw material and the halide are reacted to generate gallium halide gas, which is supplied onto the base substrate for film formation. At the same time, $O_2$ gas is supplied onto the base substrate for film formation, and the reaction between the gallium halide gas and the $O_2$ gas causes $Ga_2O_3$ to grow on the base substrate for film formation. This method has been widely used industrially due to its high speed and thick film growth capability, and examples of film formation of not only $\alpha\text{-}Ga_2O_3$ but also $\beta\text{-}Ga_2O_3$ have been reported.

Figure 3:
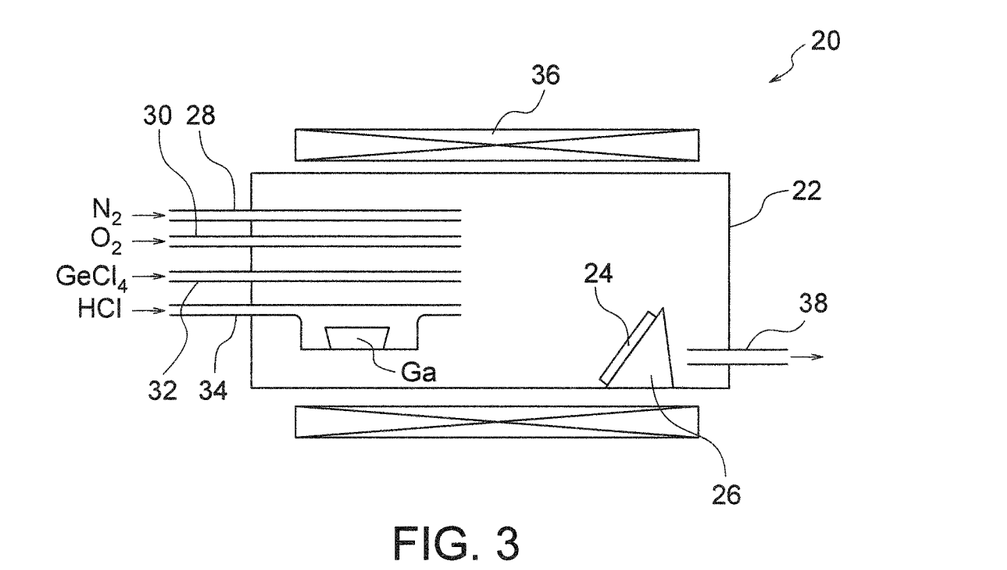
FIG. 3 is a schematic cross-sectional view showing a configuration of an HVPE (halide vapor phase epitaxy) apparatus.

FIG. 3 shows an example of a vapor deposition apparatus using a HVPE method (HVPE apparatus). A HVPE apparatus 20 includes a reactor 22, a susceptor 26 on which a base substrate for film formation 24 is placed, an oxygen raw material supply source 30, a carrier gas supply source 28, a $GeCl_4$ supply source 32, a Ga raw material supply source 34, a heater 36, and a gas discharge unit 38. The reactor 22 may be any reactor that does not react with the raw material, such as a quartz tube. The heater 36 may be any heater capable of heating up to at least 700° C. (preferably 900° C. or higher), for example, a resistance heating type heater.

A metal Ga is placed inside the Ga raw material supply source 34, and a halogen gas or a hydrogen halide gas, for example, HCl is supplied. The halogen gas or halogenated gas is preferably $Cl_2$ or HCl. The supplied halogen gas or halogenated gas reacts with the metal Ga to generate gallium halide gas, which is supplied to the base substrate for film formation 24. The gallium halide gas preferably contains GaCl and/or $GaCl_3$. The oxygen raw material supply source 30 can supply an oxygen source selected from the group consisting of $O_2$, $H_2O$ and $N_2O$, and $O_2$ is preferable. These oxygen raw material gases are supplied to the base substrate at the same time as the gallium halide gas. The $GeCl_4$ supply source 32 supplies a $GeCl_4$ vapor generated by bubbling a $GeCl_4$ liquid into the reactor 22. The Ga raw material and the oxygen raw material gas may be supplied together with a carrier gas such as $N_2$ or a rare gas.

The gas discharge unit 38 may be connected to a vacuum pump such as a diffusion pump or a rotary pump, for example, and may control not only the discharge of unreacted gas in the reactor 22 but also the inside of the reactor 22 under reduced pressure. This can suppress the gas phase reaction and improve the growth rate distribution.

By heating the base substrate for film formation 24 to a predetermined temperature using the heater 36 and simultaneously supplying the gallium halide gas and the oxygen raw material gas, $\alpha\text{-}Ga_2O_3$ is formed on the base substrate for film formation 24. The film formation temperature is not particularly limited as long as $\alpha\text{-}Ga_2O_3$ is formed and voids are generated in the film, but is typically 250° C. to 900° C., for example. The partial pressure of the Ga raw material gas and the oxygen raw material gas is also not particularly limited. For example, the partial pressure of the Ga raw material gas (gallium halide gas) may be in the range of 0.05 kPa or more and 10 kPa or less, and the partial pressure of the oxygen raw material gas may be in the range of 0.25 kPa or more and 50 kPa or less.

In a case where an α-Ga$_2$O$_3$ based semiconductor film containing a Group 14 element is formed, or in the case where a mixed crystal film with α-Ga$_2$O$_3$ containing an oxide of In or Al is formed as a dopant, these halides may be supplied from a separate supply source (for example, GeCl$_4$ supply source 32 in FIG. 3), or these halides may be mixed and supplied from the Ga raw material supply source 34. Further, a material containing a Group 14 element, In, Al or the like may be placed in the same place as the metal Ga, reacted with a halogen gas or a hydrogen halide gas, and supplied as a halide. These halide gas supplied to the base substrate for film formation 24 react with the oxygen raw material gas to form oxides in the same manner as gallium halide, and are incorporated into the α-Ga$_2$O$_3$ system semiconductor film.

Figure 4:
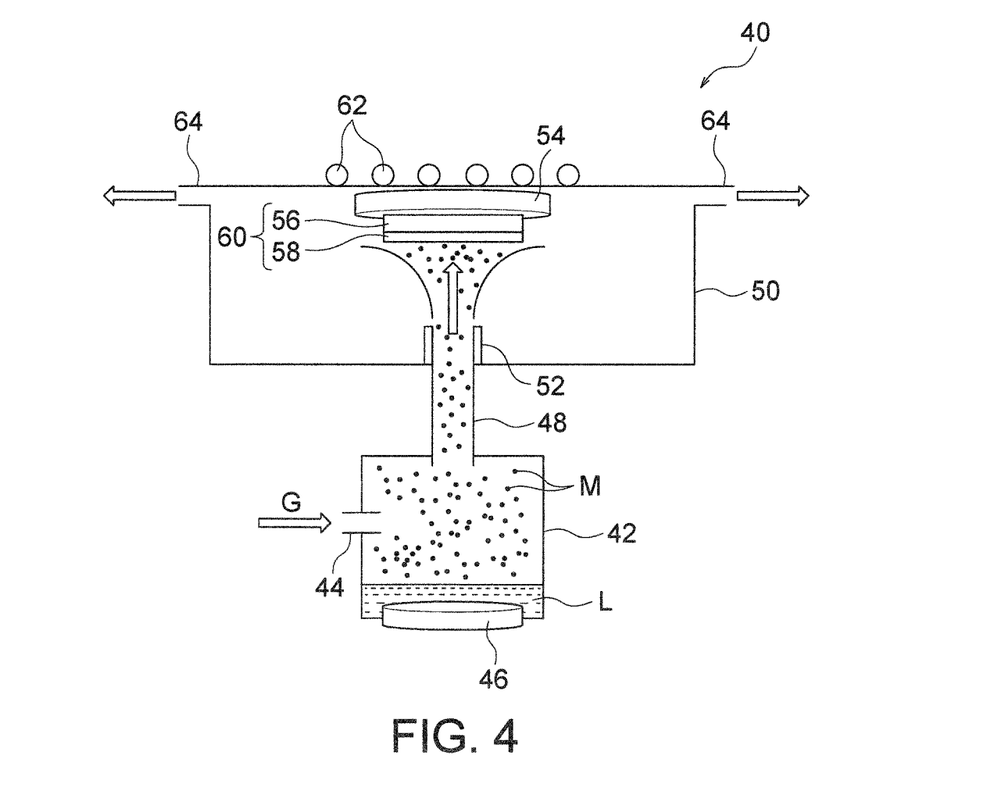
FIG. 4 is a schematic cross-sectional view showing a configuration of a mist chemical vapor deposition (CVD) apparatus.

The mist CVD method is a method in which a raw material solution is atomized or formed into droplets to generate mist or droplets, the mist or droplets are transported to a film forming chamber including a substrate using a carrier gas, and the mist or droplets are thermally decomposed and chemically reacted in the film forming chamber to form and grow a film on the substrate, and thus does not require a vacuum process and can produce a large number of samples in a short time. Here, FIG. 4 shows an example of a mist CVD apparatus. A mist CVD apparatus 40 shown in FIG. 4 has a mist generating chamber 42 that generates a mist M from a carrier gas G and a raw material solution L, and a film forming chamber 50 that sprays the mist M onto a substrate 56 to form a semiconductor film 58 through thermal decomposition and chemical reaction. The mist generating chamber 42 includes a carrier gas introduction port 44 into which the carrier gas G is introduced, an ultrasonic vibrator 46 provided in the mist generating chamber 42, and a duct 48 that conveys the mist M generated in the mist generating chamber 42 to the film forming chamber 50. The raw material solution L is stored in the mist generating chamber 42. The ultrasonic vibrator 46 is configured to apply ultrasonic vibration to the raw material solution L to generate the mist M together with the carrier gas G. The film forming chamber 50 includes a nozzle 52 for spraying the mist M introduced through the duct 48 onto the substrate 56, a stage 54 to which the substrate 56 is fixed, a heater 62 provided near the rear surface of the stage 54 for heating the stage 54 and the substrate 56, and an exhaust port 64 for discharging the carrier gas G.

The raw material solution L used in the mist CVD method is not limited as long as an α-Ga$_2$O$_3$ based semiconductor film can be obtained, and examples thereof include an organometallic complex or halide of Ga and/or a metal forming a solid solution with Ga dissolved in a solvent. Examples of organometallic complexes include acetylacetonate complexes. Further in a case where a dopant is added to the semiconductor layer, a solution of a dopant component may be added to the raw material solution. Furthermore, an additive such as hydrochloric acid may be added to the raw material solution. Water, alcohol, or the like can be used as the solvent.

Next, the obtained raw material solution L is atomized or formed into droplets to generate mist M or droplet. A preferable example of the atomizing or droplet forming method is a method of vibrating the raw material solution L using the ultrasonic vibrator 46. Then, the obtained mist M or droplet is transported to the film forming chamber 50 using a carrier gas G. The carrier gas G is not particularly limited, but one or more of an inert gas such as oxygen, ozone and nitrogen, and a reducing gas such as hydrogen can be used.

The substrate 56 is provided in the film forming chamber 50. The mist M or droplet transported to the film forming chamber 50 is thermally decomposed and chemically reacted there to form the semiconductor film 58 on the substrate 56. The reaction temperature varies depending on the kind of the raw material solution L, but is preferably 300 to 800° C., and more preferably 400 to 700° C. Further, the atmosphere in the film forming chamber 50 is not particularly limited as long as a desired semiconductor film can be obtained, but is typically selected from any of an oxygen gas atmosphere, an inert gas atmosphere, a vacuum atmosphere, a reducing atmosphere, and an air atmosphere.

The semiconductor film thus obtained can be formed as it is or divided into semiconductor elements. Alternatively, the semiconductor film may be detached from the composite base substrate to form a single film. In this case, in order to facilitate the detachment from the composite base substrate, a semiconductor film in which a release layer is provided in advance on the orientation layer surface (film forming surface) of the composite base substrate may be used. Examples of such a release layer include those provided with a C injection layer and an H injection layer on the surface of the composite base substrate. Further, C or H may be injected into the film at the initial stage of film formation of the semiconductor film, and a release layer may be provided on the semiconductor film side. Furthermore, it is also possible to adhere and bond a support substrate (mounting substrate) different from the composite base substrate to the surface of the semiconductor film formed on the composite base substrate (that is, the opposite side of the composite base substrate), and then detach and remove the composite base substrate from the semiconductor film. As such a support substrate (mounting substrate), a substrate having a coefficient of thermal expansion at 25 to 400° C. of 6 to 13 ppm/K, for example, a substrate composed of a Cu—Mo composite metal can be used. Further, example of the method of adhering and bonding the semiconductor film and the support substrate (mounting substrate) include known methods such as brazing, soldering, and solid phase bonding. Further, an electrode such as an ohmic electrode or a Schottky electrode, or another layer such as an adhesive layer may be provided between the semiconductor film and the support substrate.

In the manufacture of semiconductor devices such as power devices, a functional layer such as a drift layer is formed on the semiconductor film. A known method is also possible for forming a functional layer such as a drift layer, and preferred examples thereof include a mist CVD method, an HVPE method, an MBE method, an MOCVD method, and a hydrothermal synthesis method, and the mist CVD method or the HVPE method is particularly preferred.

Method for Manufacturing Composite Base Substrate

The composite base substrate described above can be preferably manufactured by (a) providing a sapphire substrate, (b) preparing a predetermined orientation precursor layer, (c) performing heat treatment on the orientation precursor layer on the sapphire substrate to convert at least a portion near the sapphire substrate into an orientation layer, and optionally (d) subjecting the orientation layer to processing such as grinding or polishing to expose the surface of the orientation layer. This orientation precursor layer becomes an orientation layer by heat treatment and contains a material having a corundum-type crystal structure having an a-axis length and/or c-axis length larger than that of sapphire, or a material capable of having a corundum-type crystal structure having an a-axis length and/or c-axis length larger than that of sapphire by heat treatment to be described later. Further, the orientation precursor layer may contain trace components in addition to the material having a corundum-type crystal structure. According to such a production method, the growth of the orientation layer can be promoted by using the sapphire substrate as a seed crystal. That is, the high crystallinity and crystal orientation peculiar to the single-crystal of the sapphire substrate are inherited by the orientation layer.

(a) Provision of Sapphire Substrate

To prepare the base substrate, first, a sapphire substrate is provided. The sapphire substrate used may have any orientation plane. That is, the sapphire substrate may have an a-plane, a c-plane, an r-plane, or an m-plane, or may have a predetermined off-angle with respect to these planes. For example, in a case where a c-plane sapphire is used, since the c-axis is oriented with respect to the surface, it is possible to easily heteroepitaxially grow a c-axis oriented orientation layer thereon. A sapphire substrate to which a dopant is added may also be used to adjust electrical properties. As such a dopant, a known dopant can be used.

(b) Preparation of Orientation Precursor Layer

An orientation precursor layer containing a material having a corundum-type crystal structure having an a-axis length and/or c-axis length larger than that of sapphire, or a material capable of having a corundum-type crystal structure having an a-axis length and/or c-axis length larger than that of sapphire by heat treatment is prepared. The method for forming the orientation precursor layer is not particularly limited, and a known method can be adopted. Examples of the method for forming the orientation precursor layer include an aerosol deposition (AD) method, a sol-gel method, a hydrothermal method, a sputtering method, an evaporation method, various chemical vapor deposition (CVD) methods, a PLD method, a chemical vapor transport (CVT) method, and a sublimation method. Examples of the CVD method include a thermal CVD method, a plasma CVD method, a mist CVD method, and an MO (metal organic) CVD method. Alternatively, a method may be used in which a molded body of the orientation precursor is prepared in advance and the molded body is placed on a sapphire substrate. Such a molded body can be produced by molding the material of the orientation precursor by a method such as tape casting or press molding. Further, it is also possible to use a method in which a polycrystal prepared in advance by various CVD methods, sintering, or the like is used as the orientation precursor layer and is placed on a sapphire substrate.

However, an aerosol deposition (AD) method, various CVD methods, or a sputtering method is preferred. By using these methods, a dense orientation precursor layer can be formed in a relatively short time, and heteroepitaxial growth using a sapphire substrate as a seed crystal can be easily caused. In particular, the AD method does not require a high vacuum process and has a relatively high film formation rate, and is therefore preferable in terms of production cost. In the case of using a sputtering method, a film can be formed using a target of the same material as that of the orientation precursor layer, but a reactive sputtering method in which a film is formed in an oxygen atmosphere using a metal target can also be used. A method of placing a molded body prepared in advance on sapphire is also preferable as a simple method, but since the orientation precursor layer is not dense, a process of densification is required in the heat treatment step described later. In the method of using a polycrystalline prepared in advance as an orientation precursor layer, two steps of a step of preparing a polycrystalline body and a step of performing heat treatment on a sapphire substrate are required. Further, in order to improve the adhesion between the polycrystal and the sapphire substrate, it is necessary to take measures such as keeping the surface of the polycrystal sufficiently smooth. Although known conditions can be used for any of the methods, a method of directly forming an orientation precursor layer using an AD method and a method of placing a molded body prepared in advance on a sapphire substrate will be described below.

Figure 5:
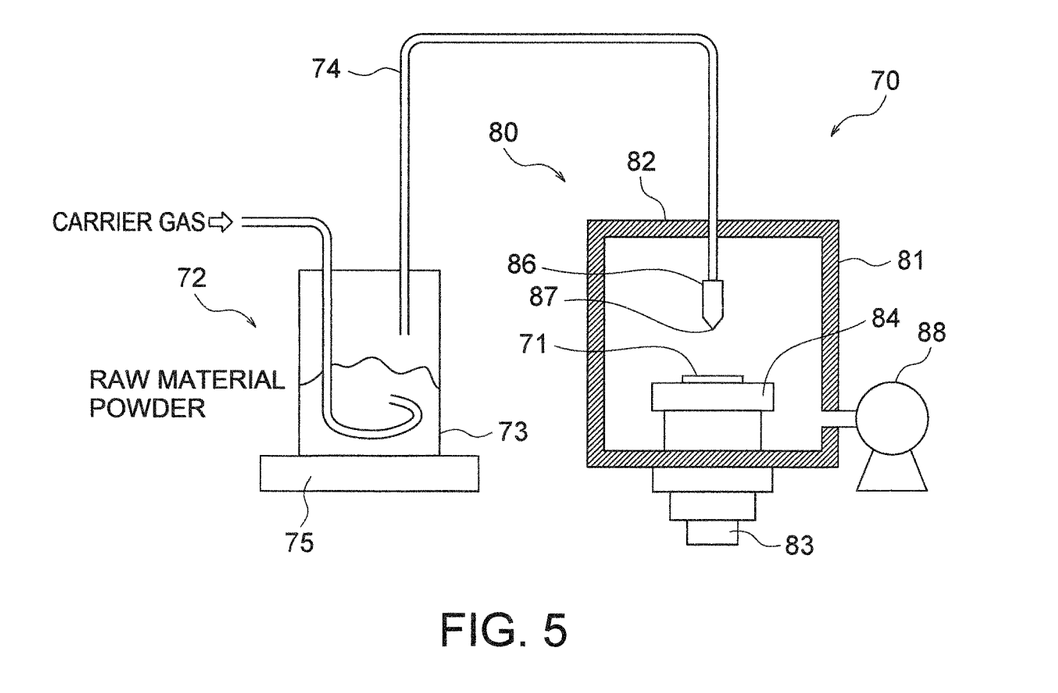
FIG. 5 is a schematic cross-sectional view showing a configuration of an aerosol deposition (AD) apparatus.

The AD method is a technique for forming a film by mixing fine particles or a fine particle raw material with a gas to form an aerosol, and impacting the aerosol on a substrate by injecting the aerosol at a high speed from a nozzle, and has a feature of forming a film densified at ordinary temperature. FIG. 5 shows an example of a film forming apparatus (aerosol deposition (AD) apparatus) used in such an AD method. The film forming apparatus 70 shown in FIG. 5 is configured as an apparatus used in an AD method in which a raw material powder is injected onto a substrate in an atmosphere having a pressure lower than atmospheric pressure. The film forming apparatus 70 includes an aerosol generating unit 72 that generates an aerosol of raw material powder containing raw material components, and a film forming unit 80 that forms a film containing the raw material components by injecting the raw material powder onto the sapphire substrate 71. The aerosol generating unit 72 includes an aerosol generating chamber 73 that stores raw material powder and receives a carrier gas supply from a gas cylinder (not shown) to generate an aerosol, and a raw material supply pipe 74 that supplies the generated aerosol to the film forming unit 80, and a vibrator 75 that applies vibration at frequencies of 10 to 100 Hz to the aerosol generating chamber 73 and the aerosol therein. The film forming unit 80 has a film forming chamber 82 that injects aerosols onto the sapphire substrate 71, a substrate holder 84 that is disposed inside the film forming chamber 82 and fixes the sapphire substrate 71, and an X-Y stage 83 that moves the substrate holder 84 in the X-Y axis direction. Further, the film forming unit 80 includes an injection nozzle 86 in which a slit 87 is formed at a tip thereof to inject aerosol into the sapphire substrate 71, and a vacuum pump 88 for reducing the pressure in the film forming chamber 82.

It is known that the AD method can control a film thickness, a film quality, and the like according to film forming conditions. For example, the form of the AD film is easily affected by the collision rate of the raw material powder to the substrate, the particle size of the raw material powder, the aggregated state of the raw material powder in the aerosol, the injection amount per unit time, and the like. The collision rate of the raw material powder with the substrate is affected by the differential pressure between the film forming chamber 82 and the injection nozzle 86, the opening area of the injection nozzle, and the like. If appropriate conditions are not used, the coating may become a green compact or generate pores, so it is necessary to appropriately control these factors.

In a case where a molded body in which the orientation precursor layer is prepared in advance is used, the raw material powder of the orientation precursor can be molded to prepare the molded body. For example, in a case where press molding is used, the orientation precursor layer is a press molded body. The press molded body can be prepared by press-molding the raw material powder of the orientation precursor based on a known method, and may be prepared, for example, by placing the raw material powder in a mold and pressing the raw material powder at pressures of preferably 100 to 400 kgf/cm$^2$, and more preferably 150 to 300 kgf/cm². The molding method is not particularly limited, and in addition to press molding, tape casting, slip casting, extrusion molding, doctor blade method, and any combination thereof can be used. For example, in the case of using tape casting, it is preferable that additives such as a binder, a plasticizer, a dispersant, and a dispersion medium are appropriately added to the raw material powder to form a slurry, and the slurry is discharged and molded into a sheet shape by passing through a slit-shaped thin discharge port. The thickness of the molded body formed into a sheet is not limited, but is preferably 5 to 500 μm from the viewpoint of handling. Further, in a case where a thick orientation precursor layer is required, a large number of these sheet molded bodies may be stacked and used as a desired thickness.

In these molded bodies, the portion near the sapphire substrate becomes an orientation layer by the subsequent heat treatment on the sapphire substrate. As described above, in such a method, it is necessary to sinter and densify the molded body in the heat treatment step described later. Therefore, the molded body may contain trace components such as a sintering aid in addition to the material having or resulting in a corundum-type crystal structure.

(c) Heat Treatment of Orientation Precursor Layer on Sapphire Substrate

A heat treatment is performed on the sapphire substrate on which the orientation precursor layer is formed at a temperature of 1000° C. or more. By this heat treatment, at least a portion of the orientation precursor layer near the sapphire substrate can be converted into a dense orientation layer. Further, this heat treatment enables heteroepitaxial growth of the orientation layer. That is, by forming the orientation layer with a material having a corundum-type crystal structure, heteroepitaxial growth occurs in which the material having a corundum-type crystal structure crystal grows using a sapphire substrate as a seed crystal during heat treatment. At that time, the crystals are rearranged, and the crystals are arranged according to the crystal plane of the sapphire substrate. As a result, the crystal axes of the sapphire substrate and the orientation layer can be aligned. For example, when a c-plane sapphire substrate is used, both the sapphire substrate and the orientation layer can be c-axis oriented with respect to the surface of the base substrate. Moreover, this heat treatment makes it possible to form a gradient composition region in a part of the orientation layer. That is, during the heat treatment, a reaction occurs at the interface between the sapphire substrate and the orientation precursor layer, and the Al component in the sapphire substrate diffuses into the orientation precursor layer, and/or the component in the orientation precursor layer diffuses into the sapphire substrate, thereby forming a gradient composition region composed of a solid solution containing $\alpha\text{-Al}_2\text{O}_3$.

It is known that methods such as various CVD methods, a sputtering method, a PLD method, a CVT method, and a sublimation method may cause heteroepitaxial growth on a sapphire substrate without heat treatment at 1000° C. or more. However, it is preferable that the orientation precursor layer is in a non-oriented state, that is, amorphous or non-oriented polycrystalline, at the time of preparation thereof, and the crystal rearrangement is caused by using sapphire as a seed crystal at the time of the heat treatment step. By doing so, it is possible to effectively reduce the crystal defects that reach the surface of the orientation layer. The reason for this is not clear, but it is considered that the crystal defects generated in the lower portion of the orientation layer are likely to be annihilated.

The heat treatment is not particularly limited as long as a corundum-type crystal structure is obtained and heteroepitaxial growth using a sapphire substrate as a seed occurs, and can be performed in a known heat treatment furnace such as a tubular furnace or a hot plate. Further, in addition to the heat treatment under normal pressure (without pressing), a heat treatment under pressure such as hot pressing or HIP, or a combination of a heat treatment under normal pressure and a heat treatment under pressure can also be used. The heat treatment conditions can be appropriately selected depending on the material used for the orientation layer. For example, the atmosphere of the heat treatment can be selected from the air, vacuum, nitrogen and inert gas atmosphere. The preferred heat treatment temperature also varies depending on the material used for the orientation layer, but is preferably 1000 to 2000° C., and more preferably 1200 to 2000° C., for example. The heat treatment temperature and the retention time are related to the thickness of the orientation layer formed by heteroepitaxial growth and the thickness of the gradient composition region formed by diffusion with the sapphire substrate, and can be appropriately adjusted depending on the kind of the material, the target orientation layer, the thickness of the gradient composition region, and the like. However, in the case of using molded body prepared in advance is used as the orientation precursor layer, it is necessary to perform sintering and densification during heat treatment, and normal pressure firing at a high temperature, hot pressing, HIP, or a combination thereof is suitable. For example, when using a hot press, the surface pressure is preferably 50 kgf/cm² or more, more preferably 100 kgf/cm² or more, particularly preferably 200 kgf/cm² or more, the upper limit is not particularly limited. The firing temperature is also not particularly limited as long as sintering, densification, and heteroepitaxial growth occur, but is preferably 1000° C. or more, more preferably 1200° C. or more, still more preferably 1400° C. or more, and particularly preferably 1600° C. or more. The firing atmosphere can also be selected from atmosphere, vacuum, nitrogen and an inert gas atmosphere. As the firing jig such as a mold, those made of graphite or alumina can be used.

(d) Exposure of Surface of Orientation Layer

On the orientation layer formed near the sapphire substrate by the heat treatment, an orientation precursor layer or a surface layer having poor orientation or no orientation may exist or remain. In this case, it is preferable that the surface derived from the orientation precursor layer is subjected to processing such as grinding or polishing to expose the surface of the orientation layer. By doing so, a material having excellent orientation is exposed on the surface of the orientation layer, so that the semiconductor layer can be effectively epitaxially grown on the material. The method for removing the orientation precursor layer and the surface layer is not particularly limited, and examples thereof include a method for grinding and polishing and a method for ion beam milling. The surface of the orientation layer is preferably polished by lapping using abrasive grains or chemical mechanical polishing (CMP).

EXAMPLES

The present invention will be described in more detail with reference to the following examples.

Example 1

(1) Preparation of $\alpha\text{-Ga}_2\text{O}_3$ Based Semiconductor Film by HVPE Method (1a) Preparation of Base Substrate A c-plane sapphire substrate (off-angle 0°) having a thickness of 2.0 mm and a diameter of 15.24 cm (6 inches) was prepared as a base substrate.

(1b) Film Formation

The HVPE apparatus 20 having a configuration shown in FIG. 3 was prepared. The configuration of the HVPE apparatus 20 is as described above. Metal Ga was placed in the reactor 22 and hydrogen chloride gas (HCl) was supplied. As a result, the metal Ga and hydrogen chloride were reacted to generate a halide of Ga, which was supplied to the base substrate for film formation 24. Further, the $GeCl_4$ liquid was bubbled (not shown), and the vapor of $GeCl_4$ thus obtained was supplied into the reactor 22. At the same time, $O_2$ gas as an oxygen raw material and $N_2$ gas as a carrier gas were introduced into the reactor 22. In this manner, film formation by the HVPE method was performed at a growth temperature of 530° C. for 20 minutes to obtain the base substrate for film formation 24 and the semiconductor film formed thereon as a composite material.

(2) Evaluation (2a) Surface EDX

As a result of composition analysis by energy dispersive X-ray analysis (EDX) on the surface of the obtained semiconductor film, only Ga and O were detected. From this, it was found that the obtained semiconductor film is composed of Ga oxide.

(2b) Surface EBSD

An SEM (SU-5000, manufactured by Hitachi High-Technologies Corporation) equipped with an electron backscatter diffraction apparatus (EBSD) (Nordlys Nano, manufactured by Oxford Instruments Inc.) was used to perform reverse pole figure orientation mapping of the Ga oxide film surface in a field of view of 500 μm×500 μm. The conditions for this EBSD measurement were as follows.

<EBSD Measurement Conditions>
Acceleration voltage: 15 kV
Spot intensity: 70
Working distance: 22.5 mm
Step size: 0.5 μm
Sample tilt angle: 70°
Measurement program: Aztec (version 3.3)

From the obtained reverse pole figure orientation mapping, it was found that the Ga oxide film has a biaxially oriented corundum-type crystal structure in which the Ga oxide film was c-axis oriented in the substrate normal direction with in-plane orientation. From these results, it was confirmed that the obtained semiconductor film was an orientation film having a corundum-type crystal structure composed of α-$Ga_2O_3$.

(2c) Off-Angle Measurement

The off-angle of the corundum-type Ga oxide film was measured at the center point X and the outer circumferential points A, B, C, and D on the surface of the semiconductor film shown in FIG. 2. The off-angle measurement was performed using an automatic X-ray crystal orientation measuring device (FSAS III manufactured by Rigaku) under the conditions of a sampling width of 0.01° and a scanning speed of 10°/min. The off-angles obtained at the center point X and at the outer circumferential points A, B, C, and D were respectively $\theta_X$, $\theta_A$, $\theta_B$, $\theta_C$, and $\theta_D$, and from these values, the difference between the maximum value $\theta_{max}$ and the minimum value $\theta_{min}$ of the off-angle (off-angle range), the arithmetic mean angle $\theta_{out}$ of $\theta_A$, $\theta_B$, $\theta_C$, and $\theta_D$, and the difference $\Delta\theta$ between $\theta_X$ and $\theta_{out}$ (=$\theta_{out}$-$\theta_X$) were calculated. The results are shown in Table 1.

(2d) Yield of Device

Figure 6:
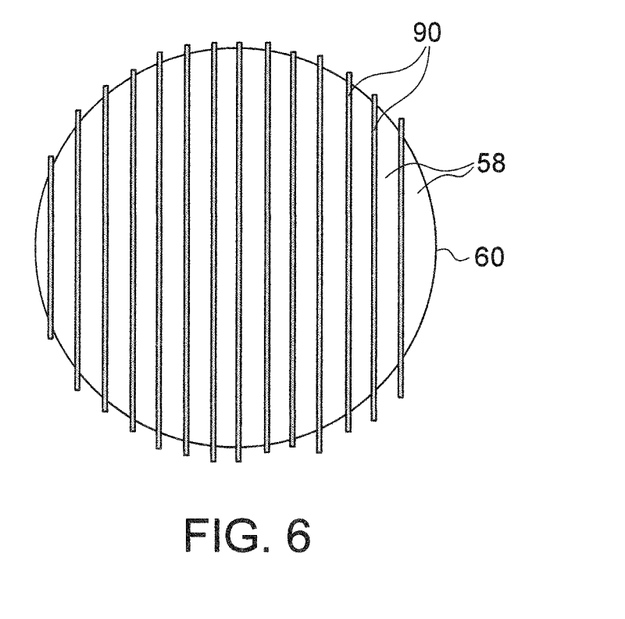
FIG. 6 is a top view showing a state in which a semiconductor film is masked with a long sapphire substrate in preparation for formation of an n⁻ layer in the production of the Schottky barrier diodes of Examples 1 to 7.
Figure 7:
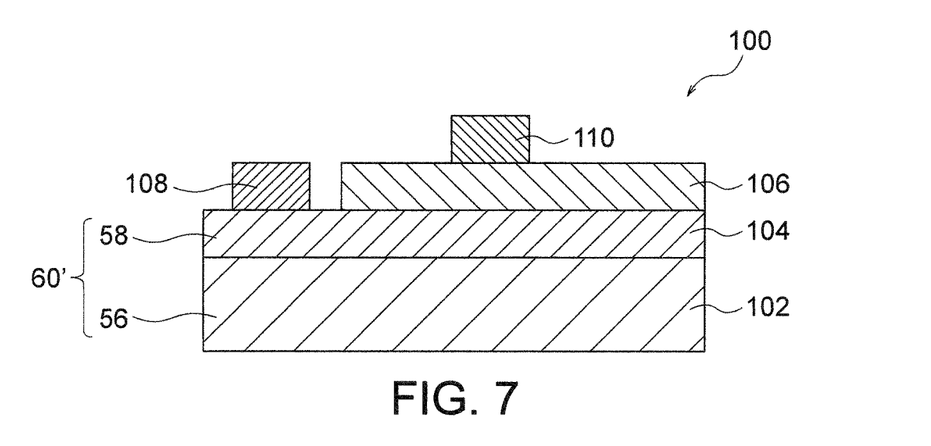
FIG. 7 is a schematic cross-sectional view showing a layer structure of a Schottky barrier diode prepared in Examples 1 to 7.

As shown in FIG. 6, on the semiconductor film 58 obtained in (1b) above, a plurality of long sapphire substrates 90 having a width of 2 mm were arranged in stripes with an interval of 8 mm and masked, and then an n⁻ layer 106 was formed as shown in FIG. 7. The formation of the n⁻ layer 106 was carried out in the same manner as in (1b) above except that $GeCl_4$ was not supplied and the film formation time was set to 10 minutes. After formation of the n⁻ layer 106, the sapphire substrate 90 as a mask was removed to expose the n⁺ layer 104. The composite material 60 was cut into a size of 10 mm square so that the exposed portion (2 mm width) of the n⁺ layer 104 was located at the end, and 148 samples were obtained. A Ti electrode 108 (ohmic electrode) having a diameter of 60 μm was formed in the exposed region of the n⁺ layer 104, and a Pt electrode 110 (Schottky electrode) was formed on the n⁻ layer 106. In this way, a horizontal Schottky barrier diode 100 as shown in FIG. 7 was produced. A predetermined voltage was applied to each of the manufactured 148 devices, and the yield was calculated by regarding a device in which dielectric breakdown did not occur as a non-defective product and a device in which dielectric breakdown occurred as a defective product. The results are shown in Table 1.

In this example, the Schottky barrier diode 100 is in the form of a horizontal device for simply evaluating the yield of the device, but a vertical device produced by removing the base substrate 56 also shows the same tendency as the horizontal device of this example.

Example 2

A semiconductor film was prepared and various evaluations were performed in the same manner as in Example 1, except that a c-plane sapphire substrate (off-angle 0°) having a thickness of 1.3 mm and a diameter of 15.24 cm (6 inches) was used instead of the base substrate in (1a). The results were as shown in Table 1.

Example 3

A semiconductor film was prepared and various evaluations were performed in the same manner as in Example 1, except that a c-plane sapphire substrate (off-angle 0°) having a thickness of 0.7 mm and a diameter of 15.24 cm (6 inches) was used instead of the base substrate in (1a). The results were as shown in Table 1.

Example 4

A semiconductor film was prepared and various evaluations were performed in the same manner as in Example 1, except that a c-plane sapphire substrate (off-angle 0.5°) having a thickness of 2.0 mm and a diameter of 15.24 cm (6 inches) was used instead of the base substrate in (1a). The results were as shown in Table 1.

Example 5

A semiconductor film was prepared and various evaluations were performed in the same manner as in Example 1, except that a composite base substrate having a thickness of 1.35 mm and a diameter of 15.24 cm (6 inches), which was produced and evaluated as follows, was used instead of the base substrate in (1a). The results were as shown in Table 1.

(Preparation of Composite Base Substrate)

(a) Preparation of Orientation Precursor Layer

An AD film composed of $Cr_2O_3$ was formed on a seed substrate (sapphire substrate) by an aerosol deposition (AD) apparatus 70 shown in FIG. 5 using $Cr_2O_3$ powder (Colortherm Green manufactured by Lanxess) as the raw material powder and a c-plane sapphire substrate having a thickness of 1.3 mm and a diameter of 15.24 cm (6 inches). The configuration of the aerosol deposition (AD) apparatus 70 is as described above.

The AD film formation conditions were as follows. That is, $N_2$ was used as a carrier gas, and a ceramic nozzle having a slit having a long side of 5 mm and a short side of 0.3 mm was used. The scanning conditions of the nozzle were to move 155 mm in the direction perpendicular to the long side of the slit and forward, to move 5 mm in the long side direction of the slit, to move 155 mm in the direction perpendicular to the long side of the slit and backward, and to move 5 mm in the long side direction of the slit and opposite to the initial position, repeatedly at a scanning speed of 0.5 mm/s, and at the time of 155 mm movement from the initial position in the long side direction of the slit, scanning was performed in the direction opposite to the previous direction, and the nozzle returned to the initial position. This was defined as one cycle, and repeated for 500 cycles. In one cycle of film formation at room temperature, the set pressure of the transport gas was adjusted to 0.06 MPa, the flow rate was adjusted to 6 L/min, and the pressure in the chamber was adjusted to 100 Pa or less. The AD film (orientation precursor layer) thus formed had a thickness of about 100 μm.

(b) Heat Treatment of Orientation Precursor Layer

The sapphire substrate on which the AD film (orientation precursor layer) was formed was taken out from the AD apparatus and annealed at 1700° C. for 4 hours in a nitrogen atmosphere.

(c) Grinding and Polishing

The obtained substrate was fixed to a ceramic surface plate, the surface on the side derived from the AD film was ground using a grinding stone having a grit size of #2000 or less until the orientation layer was exposed, and then the plate surface was further smoothed by lapping using diamond abrasive grains. At this time, lapping was performed while gradually reducing the size of the diamond abrasive grains from 3 μm to 0.5 μm, thereby improving the flatness of the plate surface. Thereafter, mirror finishing was performed by chemical mechanical polishing (CMP) using colloidal silica to obtain a composite base substrate having an orientation layer on a sapphire substrate. The surface of the substrate on the side derived from the AD film was designated as the "top surface". The arithmetical mean roughness Ra of the orientation layer surfaces after processing was 0.1 nm, the amount of grinding and polishing was about 50 μm including the polycrystalline portion and the orientation layer, and the thicknesses of the composite base substrate after polishing was 1.35 mm.

(d) Evaluation of Orientation Layer (d1) Cross-Section EDX

The composition of the cross-section orthogonal to the main surface of the substrate was analyzed by energy dispersive X-ray analyzer (EDX). As a result, only Cr and O were detected in the range from the top surface of the composite base substrate to a depth of about 20 μm. It was found that the ratio of Cr and O did not substantially change in the range of the depth of about 20 μm, and a Cr oxide layer having a thickness corresponding to about 20 μm in depth was formed. Further, Cr, O and Al were detected in the range from the Cr oxide layer to a depth of 30 μm, and it was found that a Cr—Al oxide layer (gradient composition layer) having a thickness of about 30 μm was formed between the Cr oxide layer and the sapphire substrate. In the Cr—Al oxide layer, the ratios of Cr and Al were different, and it was observed that the Al concentration was high on the sapphire substrate side and decreased on the side close to the Cr oxide layer.

(d2) Surface EBSD

An SEM (SU-5000, manufactured by Hitachi High-Technologies Corporation) equipped with an electron backscatter diffraction apparatus (EBSD) (Nordlys Nano, manufactured by Oxford Instruments Inc.) was used to perform reverse pole figure orientation mapping of the surface of the substrate composed of the Cr oxide layer in a field of view of 500 μm×500 μm. The conditions for this EBSD measurement were as follows.

<EBSD Measurement Conditions>
Acceleration voltage: 15 kV
Spot intensity: 70
Working distance: 22.5 mm
Step size: 0.5 μm
Sample tilt angle: 70°
Measurement program: Aztec (version 3.3)

Figure 8:
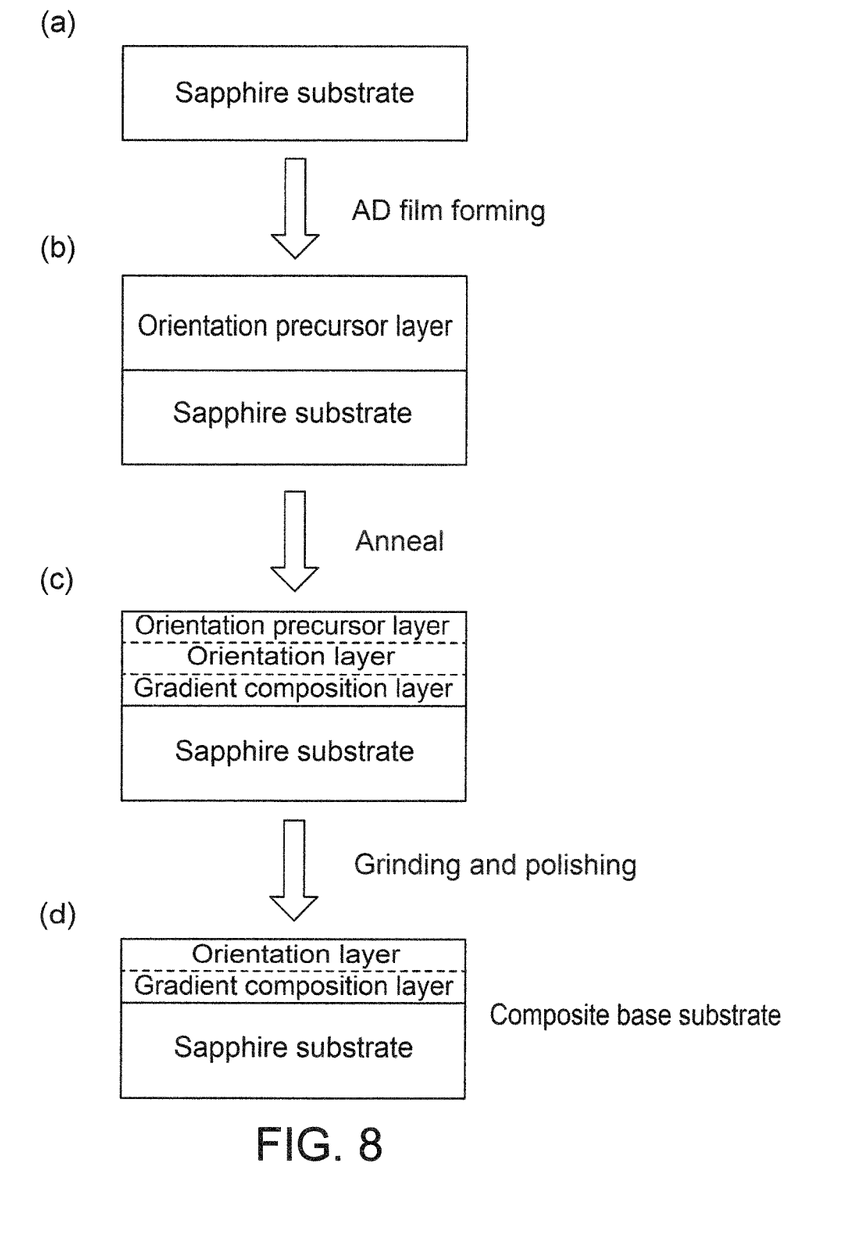
FIG. 8 is a diagram schematically showing a step of preparing a composite base substrate in Example 5.

From the obtained reverse pole figure orientation mapping, it was found that the Cr oxide layer was a layer having a biaxially oriented corundum-type crystal structure in which the Cr oxide layer was c-axis oriented in the base substrate normal direction and was also oriented in the in-plane direction. From these, it was shown that the orientation layer composed of $\alpha\text{-}Cr_2O_3$ was formed on the substrate top surface. Based on the above results, the preparation step of the composite base substrate is schematically shown in FIGS. 8(*a*) to 8(*d*).

(d3) XRD

XRD in-plane measurement of the substrate top surface was performed using a multifunctional high-resolution X-ray diffraction (XRD) apparatus (D8 DISCOVER, manufactured by Bruker AXS Inc.). Specifically, after the Z axis was adjusted in accordance with the height of the substrate surface, the axis was set by adjusting Chi, Phi, ω, and 2θ with respect to the (11-20) plane, and 2θ-ω measurement was performed under the following conditions.

<XRD Measurement Conditions>
Tube voltage: 40 kV
Tube current: 40 mA
Detector: Triple Ge (220) Analyzer
CuKα rays converted to parallel monochromatic light (full width at half maximum 28 seconds) with a Ge (022) asymmetric reflection monochromator
Step width: 0.001°
Scan speed: 1.0 second/step From the XRD measurement, it was found that the a-axis length of the orientation layer was 4.961 Å.

Example 6

(1) Preparation of $\alpha\text{-}Ga_2O_3$ Based Semiconductor Film by Mist CVD Method (1a) Preparation of Base Substrate A c-plane sapphire substrate (off-angle 0°) having a thickness of 2.0 mm and a diameter of 15.24 cm (6 inches) was prepared as a base substrate.

(1b) Preparation of Raw Material Solution

By adding metallic Ga to hydrochloric acid and stirring at room temperature for 3 weeks, a gallium chloride solution having a gallium ion concentration of 3 mol/L was obtained. Water was added to the obtained gallium chloride solution to adjust the aqueous solution so that the gallium ion concentration was 60 mmol/L. Tin (II) chloride was added to the aqueous solution to a concentration of 1.2 mmol/L, then ammonium hydroxide was added to adjust the pH to 4.0, and the solution was used as a raw material solution.

(1c) Preparation for Film Formation

The mist CVD apparatus 40 having a configuration shown in FIG. 4 was provided. The configuration of the mist CVD apparatus 40 is as described above. In the mist CVD apparatus 40, the raw material solution L obtained in (1b) above was stored in the mist generating chamber 42. A c-plane sapphire substrate having a diameter of 15.24 cm (6 inches) was set as the substrate 56 on the stage 54, and the distance between the tip of the nozzle 52 and the substrate 56 was set to 120 mm. The temperature of the stage 54 is raised to 550° C. by the heater 62 and held for 30 minutes for temperature stabilization. The flow control valve (not shown) was opened to supply nitrogen gas as the carrier gas G into the film forming chamber 50 through the mist generating chamber 42, and the atmosphere of the film forming chamber 50 was sufficiently replaced with the carrier gas G. After that, the flow rate of the carrier gas G was adjusted to 2.0 L/min.

(1d) Film Formation

A raw material solution L was atomized by an ultrasonic vibrator 46, and the generated mist M was introduced into a film forming chamber 50 by a carrier gas G. By causing the mist M to react in the film forming chamber 50, particularly on the surface of the substrate 56 (specifically, sapphire substrate), the semiconductor film 58 was formed on the substrate 56 for 90 minutes. In this way, a composite material 60 composed of the substrate 56 and the semiconductor film 58 formed thereon was obtained.

(2) Evaluation (2a) Surface EDX

As a result of composition analysis by energy dispersive X-ray analysis (EDX) on the surface of the obtained semiconductor film 58, only Ga and O were detected. From this, it was found that the semiconductor film 58 is composed of Ga oxide.

(2b) Surface EBSD

In the same manner as in Example 1 (2b), the reverse pole figure orientation mapping of the Ga oxide film surface was performed. From the obtained reverse pole figure orientation mapping, it was found that the Ga oxide film has a biaxially oriented corundum-type crystal structure in which the Ga oxide film was c-axis oriented in the substrate normal direction with in-plane orientation. From these, it was shown that an orientation film composed of $\alpha\text{-}Ga_2O_3$ was formed.

(2c) Off-Angle Measurement

The off-angle was measured in the same manner as in Example 1 (2c). The results are shown in Table 1.

(2d) Yield of Device

As shown in FIG. 6, on the semiconductor film 58 obtained in (1b) above, a plurality of long sapphire substrates 90 having a width of 2 mm were arranged in stripes with an interval of 8 mm and masked, and then an n⁻ layer 106 was formed as shown in FIG. 7. The formation of the n⁻ layer 106 was carried out in the same manner as in (1b) above except that tin (II) chloride was not supplied and the film formation time was set to 45 minutes. After formation of the n⁻ layer 106, the sapphire substrate 90 as a mask was removed to expose the n⁺ layer 104. The composite material 60 was cut into a size of 10 mm square so that the exposed portion (2 mm width) of the n⁺ layer 104 was located at the end, and 148 samples were obtained. A Ti electrode 108 (ohmic electrode) having a diameter of 60 μm was formed in the exposed region of the n⁺ layer 104, and a Pt electrode 110 (Schottky electrode) was formed on the n⁻ layer 106. In this way, a horizontal Schottky barrier diode 100 as shown in FIG. 7 was produced. A predetermined voltage was applied to each of the manufactured 148 devices, and the yield was calculated by regarding a device in which dielectric breakdown did not occur as a non-defective product and a device in which dielectric breakdown occurred as a defective product. The results are shown in Table 1.

Example 7

Comparison

A semiconductor film was prepared and various evaluations were performed in the same manner as in Example 1, except that a c-plane sapphire substrate (off-angle 0°) having a thickness of 0.4 mm and a diameter of 15.24 cm (6 inches) was used instead of the base substrate in (1a). The results were as shown in Table 1.

TABLE 1

| | Off-angle (°) | | | | | Off-angle range (°) ($\theta_{max}-\theta_{min}$) | $\theta_{out}$ (°) (Arithmetic mean value of $\theta_A$, $\theta_B$, $\theta_C$, and $\theta_D$) | $\Delta\theta$ (°) ($\theta_{out}-\theta_X$) | Yield of device (%) |
|---|---|---|---|---|---|---|---|---|---|
| | $\theta_X$ | $\theta_A$ | $\theta_B$ | $\theta_C$ | $\theta_D$ | | | | |
| Example 1 | 0.02 | 0.06 | 0.03 | 0.08 | 0.11 | 0.09 | 0.07 | 0.05 | 96 |
| Example 2 | 0.03 | 0.26 | 0.29 | 0.19 | 0.22 | 0.26 | 0.24 | 0.21 | 91 |
| Example 3 | 0.16 | 0.12 | 0.02 | 0.13 | 0.30 | 0.28 | 0.14 | −0.02 | 80 |
| Example 4 | 0.50 | 0.52 | 0.56 | 0.49 | 0.61 | 0.12 | 0.55 | 0.05 | 96 |
| Example 5 | 0.01 | 0.07 | 0.10 | 0.03 | 0.05 | 0.09 | 0.06 | 0.05 | 98 |
| Example 6 | 0.03 | 0.14 | 0.10 | 0.03 | 0.05 | 0.11 | 0.08 | 0.05 | 97 |
| Example 7* | 0.33 | 0.12 | 0.32 | 0.28 | 0.50 | 0.38 | 0.31 | −0.03 | 61 |

*indicates Comparative Example

What is claimed is:

1. A semiconductor film in a circular shape having a crystal having a corundum-type crystal structure composed of $\alpha\text{-}Ga_2O_3$ or an a-$\alpha\text{-}Ga_2O_3$ solid solution as a main phase,
wherein the maximum value $\theta_{max}$ and the minimum value $\theta_{min}$ for off-angles at the center point X and four outer circumferential points A, B, C, and D of a surface of the semiconductor film satisfy the relationship of $\theta_{max}-\theta_{min} \leq 0.30°$,
wherein the off-angle is defined as an inclination angle θ of a crystal axis oriented in a substantially normal direction of the semiconductor film with respect to a film surface normal of the semiconductor film,
wherein the outer circumferential points A, B, C, and D are determined such that i) a straight line connecting the outer circumferential points A and C and a straight line connecting the outer circumferential points B and D intersect at a right angle to each other at the center point X, and ii) the respective shortest distances of the outer circumferential points A, B, C, and D from the outer edge of the semiconductor film are ⅕ of the radius of the semiconductor film, and wherein the semiconductor film has a thickness of 0.1 to 50 μm.

2. The semiconductor film according to claim 1, wherein in a case where the off-angle at the center point X is $\theta_X$ and an arithmetic mean angle of the off-angles of the outer circumferential points A, B, C, and D is $\theta_{out}$, a relationship of $\theta_X<\theta_{out}$ is satisfied.

3. The semiconductor film according to claim 2, wherein $\Delta\theta$ representing a difference between $\theta_X$ and $\theta_{out}$ satisfies a relationship of $0°\leq\Delta\theta\leq0.20°$.

4. The semiconductor film according to claim 1, wherein the semiconductor film has a diameter of 5.08 cm (2 inches) or more.

5. The semiconductor film according to claim 1, wherein the semiconductor film is formed on a support substrate in a circular shape.

6. A composite material comprising a support substrate in a circular shape and the semiconductor film according to claim 1 formed on the support substrate.

7. The composite material according to claim 6, wherein the support substrate has a thickness of 0.5 mm or more.

\* \* \* \* \*